US012065758B2

(12) United States Patent
Kaneko et al.

(10) Patent No.: US 12,065,758 B2
(45) Date of Patent: *Aug. 20, 2024

(54) METHOD FOR MANUFACTURING A SIC SUBSTRATE BY SIMULTANEOUSLY FORMING A GROWTH LAYER ON ONE SURFACE AND ETCHING ANOTHER SURFACE OF A SIC BASE SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Natsuki Yoshida, Hyogo (JP); Kazufumi Aoki, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 286 days.

This patent is subject to a terminal disclaimer.

(21) Appl. No.: 17/436,304

(22) PCT Filed: Mar. 3, 2020

(86) PCT No.: PCT/JP2020/008966
§ 371 (c)(1),
(2) Date: Sep. 3, 2021

(87) PCT Pub. No.: WO2020/179795
PCT Pub. Date: Sep. 10, 2020

(65) Prior Publication Data
US 2022/0178048 A1 Jun. 9, 2022

(30) Foreign Application Priority Data

Mar. 5, 2019 (JP) .................................. 2019-040072
Mar. 29, 2019 (JP) .................................. 2019-069280
Mar. 29, 2019 (JP) .................................. 2019-069281

(51) Int. Cl.
  *C30B 23/06* (2006.01)
  *C23C 14/06* (2006.01)
  (Continued)

(52) U.S. Cl.
  CPC .......... *C30B 29/36* (2013.01); *C23C 14/0635* (2013.01); *C23C 14/5873* (2013.01);
  (Continued)

(58) Field of Classification Search
  CPC ......... C30B 23/00; C30B 23/02; C30B 23/06; C30B 23/063; C30B 23/066; C30B 29/00;
  (Continued)

(56) References Cited

U.S. PATENT DOCUMENTS 6,214,108 B1 * 4/2001 Okamoto ................ C30B 29/36
                                                  427/249.17
2002/0197830 A1 * 12/2002 Watanabe ........... C23C 16/4488
                                                  438/494
(Continued)

FOREIGN PATENT DOCUMENTS

CN    103820768 A    5/2014
CN    103943510 A    7/2014
(Continued)

OTHER PUBLICATIONS

International Search Report from PCT/JP2020/008966 dated Apr. 7, 2020 (4 pages).
(Continued)

*Primary Examiner* — Kenneth A Bratland, Jr.
(74) *Attorney, Agent, or Firm* — Calfee, Halter & Griswold LLP (57) ABSTRACT

An apparatus for producing an SiC substrate, by which an SiC substrate having a thin base substrate layer is able to be
(Continued)

produced, while suppressing deformation or breakage, includes a main container which is capable of containing an SiC base substrate, and which produces a vapor pressure of a vapor-phase species containing elemental Si and a vapor-phase species containing elemental C within the internal space by means of heating; and a heating furnace which contains the main container and heats the main container so as to form a temperature gradient, while producing a vapor pressure of a vapor-phase species containing elemental Si within the internal space. The main container has a growth space in which a growth layer is formed on one surface of the SiC base substrate, and an etching space in which the other surface of the SiC base substrate is etched.

9 Claims, 4 Drawing Sheets

(51) Int. Cl.
| | | |
|---|---|---|
| *C23C 14/58* | (2006.01) | |
| *C30B 29/36* | (2006.01) | |
| *C30B 33/08* | (2006.01) | |
| *H01L 21/02* | (2006.01) | |
| *H01L 21/04* | (2006.01) | |

(52) U.S. Cl.
CPC ............ *C30B 23/06* (2013.01); *C30B 33/08* (2013.01); *H01L 21/02378* (2013.01); *H01L 21/02433* (2013.01); *H01L 21/02529* (2013.01); *H01L 21/02573* (2013.01); *H01L 21/02631* (2013.01); *H01L 21/046* (2013.01)

(58) Field of Classification Search
CPC ......... C30B 29/10; C30B 29/36; C30B 33/00; C30B 33/02; C30B 33/08; C30B 33/12; C23C 14/0635; C23C 14/5873; H01L 21/02378; H01L 21/02433; H01L 21/02529; H01L 21/02573; H01L 21/02631; H01L 21/046
USPC .......... 117/84, 88, 94, 97, 99, 102, 106, 937, 117/951
See application file for complete search history.

(56) References Cited

U.S. PATENT DOCUMENTS

| | | | |
|---|---|---|---|
| 2010/0193799 A1* | 8/2010 | Nakano | H01L 29/1095 257/77 |
| 2015/0194319 A1 | 7/2015 | Loboda et al. | |
| 2017/0323794 A1* | 11/2017 | Anderson | H01L 29/0649 |
| 2017/0323797 A1* | 11/2017 | Torimi | C30B 33/12 |
| 2019/0136409 A1 | 5/2019 | Kaneko et al. | |
| 2022/0333270 A1* | 10/2022 | Kaneko | C30B 29/36 |

FOREIGN PATENT DOCUMENTS

| | | | |
|---|---|---|---|
| CN | 104018217 A | 9/2014 | |
| JP | 2003007619 A | 1/2003 | |
| JP | 2006036561 A | 2/2006 | |
| JP | 2017105697 A | 6/2017 | |
| JP | 2018168052 A | 11/2018 | |
| WO | 2016/076664 A1 | 5/2016 | |
| WO | 2017/188381 A1 | 11/2017 | |
| WO | WO-2017188381 A1 * | 11/2017 | C30B 23/02 |

OTHER PUBLICATIONS

Extended European Search Report issued in the corresponding EP application No. 20765860.0 dated Oct. 7, 2022.
English translation of Office Action from Chinese Application No. 202080018853.1 dated Apr. 8, 2023 (5 pages).

* cited by examiner

METHOD FOR MANUFACTURING A SIC SUBSTRATE BY SIMULTANEOUSLY FORMING A GROWTH LAYER ON ONE SURFACE AND ETCHING ANOTHER SURFACE OF A SIC BASE SUBSTRATE

CROSS-REFERENCE TO RELATED APPLICATIONS

This application is a 371 of PCT Application No. PCT/JP2020/008966 filed on Mar. 3, 2020, which claims priority to Japanese Application No. 2019-040072, filed on Mar. 5, 2019, Japanese Application No. 2019-069280, filed on Mar. 29, 2019, and Japanese Application No. 2019-069281, filed on Mar. 29, 2019, the contents of which are hereby incorporated by reference as if recited in their entirety.

TECHNICAL FIELD

The present invention relates to a method and a device for manufacturing a SiC substrate having a thin base substrate layer.

BACKGROUND ART

A conventional technique for thinning a SiC substrate has been developed for the purpose of reducing on-resistance of a SiC semiconductor device or the like.

For example, Patent Literature 1 discloses a technique of "A method for manufacturing a thin SiC wafer, comprising a thinning process of heating a SiC wafer cut out from an ingot under a Si vapor pressure to etch a surface of the SiC wafer, thereby reducing a thickness of the SiC wafer to 100 µm or lower".

CITATION LIST

Patent Literature

Patent Literature 1: JP 2017-105697 A

SUMMARY OF INVENTION

Technical Problem

According to Patent Literature 1, a thin SiC wafer can be obtained by etching the surface of the SiC wafer. On the other hand, when the SiC wafer is thinned, there is a problem that the strength of the SiC wafer decreases, which causes deformation and breakage of the SiC wafer.

An object of the present invention is to provide a method and a device for manufacturing a SiC substrate capable of manufacturing a SiC substrate having a thin base substrate layer while suppressing deformation and breakage.

Solution to Problem

In order to solve the above problem, a device for manufacturing a SiC substrate according to an aspect of the present invention includes:
   a main container capable of accommodating a SiC base substrate and configured to generate vapor pressure of a gaseous species containing Si element and a gaseous species containing C element in an internal space by heating; and
   a heating furnace that accommodates the main container, generates vapor pressure of a gaseous species containing Si element in an internal space, and performs heating in a manner to form a temperature gradient,
   the main container including a growth space in which a growth layer is formed on one surface of the SiC base substrate, and an etching space in which another surface of the SiC base substrate is etched.

As described above, since the main container has both the growth space for forming the growth layer on one surface of the SiC base substrate and the etching space for etching another surface, it is possible to manufacture the SiC substrate having a thin base substrate layer while suppressing deformation and breakage of the SiC base substrate which is an object to be processed.

In this aspect, the growth space is formed by making a portion of the main container arranged on a high temperature side of the temperature gradient face the SiC base substrate in a state where the SiC base substrate is arranged on a low temperature side of the temperature gradient.

As described above, by forming the growth space so as to face the SiC base substrate and the main container, the SiC base substrate and the main container can be grown in an environment in which the temperature distribution in the horizontal direction can be uniformly maintained. As a result, a growth layer with less thermal stress strain and the like can be formed.

In this aspect, the etching space is formed by making a portion of the main container arranged on a high temperature side of the temperature gradient face the SiC base substrate in a state where the SiC base substrate is arranged on a low temperature side of the temperature gradient.

As described above, by forming the etching space so as to face the SiC base substrate and the main container, the SiC base substrate can be etched without using machining. As a result, the base substrate layer can be thinned without forming a work-affected layer formed by processing damage.

In this aspect, the main container includes a substrate holder provided between the SiC base substrate and the main container.

As described above, by providing the substrate holder between the SiC base substrate and the main container, the growth space and the etching space can be easily formed.

In this aspect, the heating furnace includes a dopant gas supply means capable of supplying a dopant gas into the main container.

As described above, since the dopant gas can be supplied, the doping concentration of the growth layer can be controlled.

In this aspect, the main container is made of a material containing polycrystalline SiC.

As described above, in a case where the main container is made of a material containing polycrystalline SiC, vapor pressure of a gaseous species containing Si element and a gaseous species containing C element can be generated in the main container when the main container is heated by the heating furnace.

In this aspect, the heating furnace includes a high melting point container capable of accommodating the main container, and a Si vapor supply source capable of supplying Si vapor into the high melting point container.

As described above, since the heating furnace includes the high melting point container and the Si vapor supply source, the main container can be heated under the Si vapor pressure environment of a gaseous species containing Si element. This makes it possible to suppress a decrease of the gaseous species containing Si element in the main container.

The present invention also relates to a method for manufacturing a SiC substrate. That is, in a method for manufacturing a SiC substrate according to an aspect of the present invention, a growth process of forming a growth layer on one surface of a SiC base substrate and an etching process of etching another surface of the SiC base substrate are simultaneously performed.

As described above, while the growth layer is formed on one surface of the SiC base substrate, another surface is etched, so that it is possible to manufacture the SiC substrate having a thin base substrate layer while suppressing deformation and breakage of the SiC base substrate which is an object to be processed.

In this aspect, in the growth process and the etching process, the SiC base substrate is arranged inside a main container that generates vapor pressure of a gaseous species containing Si element and a gaseous species containing C element in an internal space, and the main container is heated in a manner to form a temperature gradient under an environment of vapor pressure of the gaseous species containing Si element.

In this aspect, in the growth process, the growth layer is formed by making the SiC base substrate arranged on the low temperature side of the temperature gradient face a portion of the main container arranged on the high temperature side of the temperature gradient.

In this aspect, in the etching process, the SiC base substrate arranged on the high temperature side of the temperature gradient and a portion of the main container arranged on the low temperature side of the temperature gradient are etched while facing each other.

In this aspect, in the growth process, a doping concentration of the growth layer is made the same as a doping concentration of the SiC base substrate.

As described above, when the doping concentration of the growth layer is the same as the doping concentration of the SiC base substrate, a growth layer different from the base substrate layer can be formed without changing the conductivity. For example, it is possible to form a growth layer in which thermal stress strain is reduced as compared with the base substrate layer, a growth layer in which basal plane dislocation is reduced, and a growth layer in which formation of macro-step bunching is suppressed.

In this aspect, in the growth process, a doping concentration of the growth layer is made lower than a doping concentration of the SiC base substrate.

As described above, in a case where the doping concentration of the growth layer is set to be lower than the doping concentration of the SiC base substrate, the growth layer can be used as a withstand voltage layer of the device, so that the base substrate layer can be thinned to contribute to reduction in on-resistance of the SiC semiconductor device.

In this aspect, in the growth process, a doping concentration of the growth layer is made higher than a doping concentration of the SiC base substrate.

As described above, in a case where the doping concentration of the growth layer is set to be higher than the doping concentration of the SiC base substrate, the SiC substrate can be a highly doped substrate, and it is possible to contribute to the reduction of the on-resistance of the SiC semiconductor device.

In this aspect, the etching process and the growth process are processes of arranging the SiC substrate in a space in which air is exhausted through an environment of vapor pressure of a gaseous species containing Si element and heating the SiC substrate.

Advantageous Effects of Invention

According to the disclosed technology, it is possible to provide a method and a device for manufacturing a SiC substrate capable of manufacturing a SiC substrate having a thin base substrate layer while suppressing deformation and breakage.

Other problems, features and advantages will become apparent from reading of the following Description of Embodiments when taken up in conjunction with the drawings and claims.

DESCRIPTION OF EMBODIMENTS

Hereinafter, a preferred embodiment of the present invention illustrated in the drawings will be described in detail with reference to FIGS. 1 to 7. The technical scope of the present invention is not limited to the embodiments illustrated in the accompanying drawings, and can be appropriately changed within the scope described in the claims.

[Device for Manufacturing SiC Substrate]

Hereinafter, a device for manufacturing a SiC substrate according to an embodiment of the present invention will be described in detail.

Figure 1:
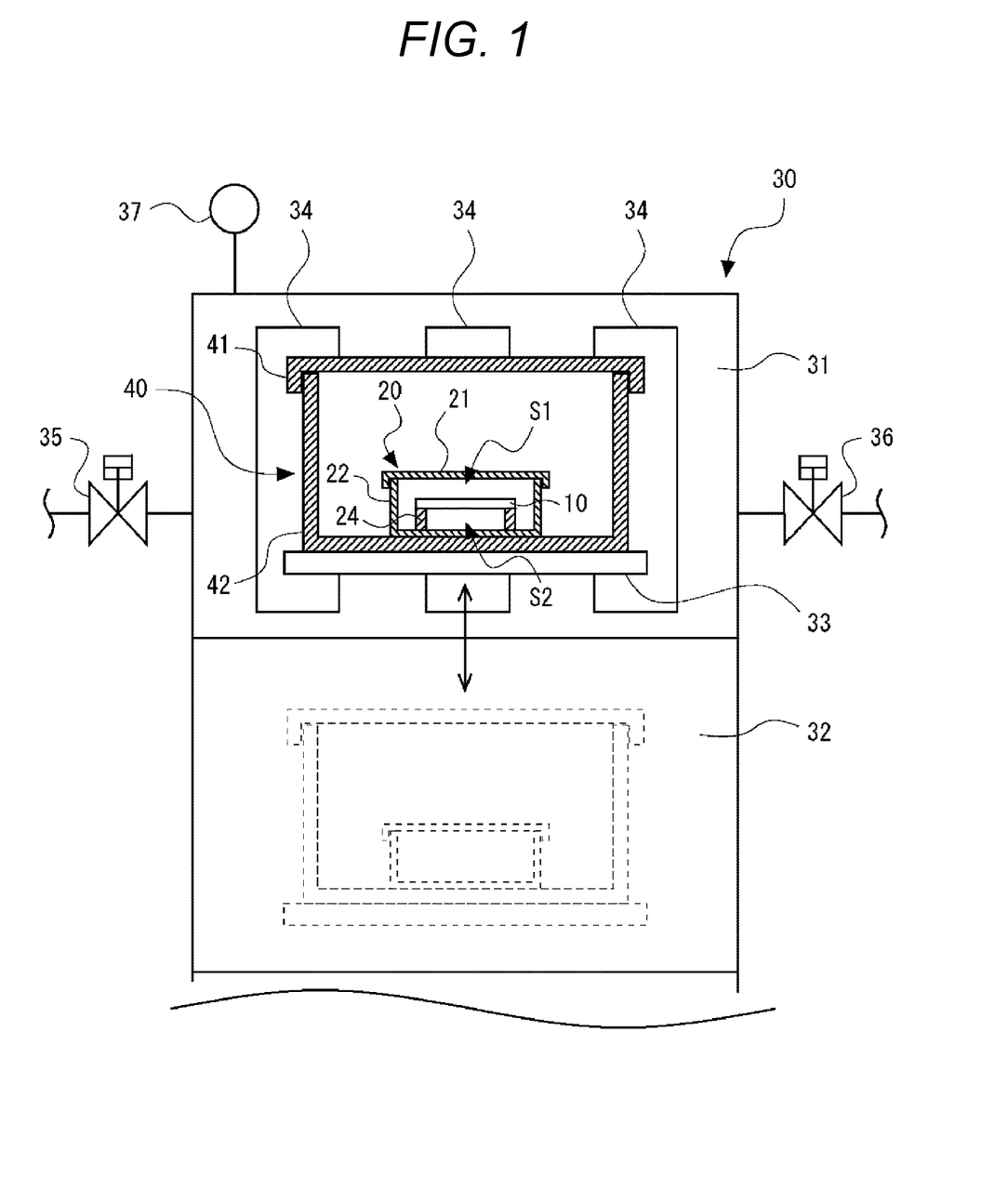
FIG. 1 is a schematic view of a device for manufacturing a SiC substrate according to an embodiment.

As illustrated in FIG. 1, a device for manufacturing a SiC substrate according to the present embodiment includes: a main container 20 capable of accommodating a SiC base substrate 10 and configured to generate vapor pressure of a gaseous species containing Si element and a gaseous species containing C element in an internal space by heating; and a heating furnace 30 that accommodates the main container 20, generates vapor pressure of a gaseous species containing Si element in an internal space, and performs heating in a manner to form a temperature gradient.

The main container 20 includes a growth space S1 in which a growth layer 11 is formed on one surface of the SiC base substrate 10, and an etching space S2 in which another surface of the SiC base substrate 10 is etched.

Figure 2:
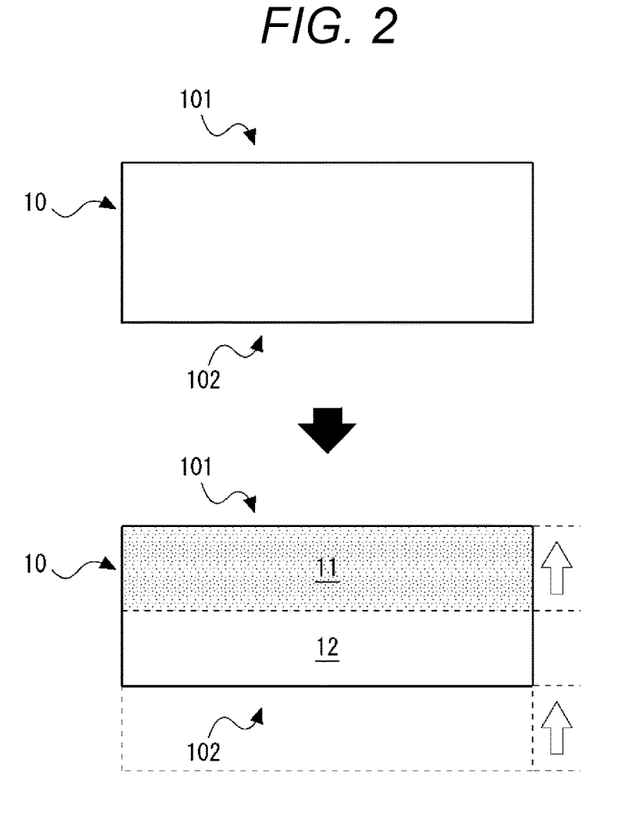
FIG. 2 is an explanatory view of a SiC substrate grown and etched by a device for manufacturing a SiC substrate according to the embodiment.

By using such a device for manufacturing a SiC substrate, as illustrated in FIG. 2, it is possible to perform simultaneously forming the growth layer 11 on one surface of the SiC base substrate 10 and etching another surface. As a result, it is possible to manufacture a SiC substrate having a thin base substrate layer 12 while suppressing deformation and breakage of the SiC base substrate 10 which is an object to be processed.

<SiC Base Substrate 10>

Examples of the SiC base substrate 10 can include a SiC wafer obtained by slicing an ingot produced by a sublimation method or the like into a disk shape, and a SiC substrate obtained by processing single crystal SiC into a thin plate shape. As the crystal polymorph of the single crystal SiC, any polytype can be adopted.

In the description of the present specification, a surface of the SiC base substrate 10 on which the semiconductor element is formed (specifically, a surface on which the epilayer is deposited) is referred to as a main surface 101, and a surface facing the main surface 101 is referred to as a back surface 102. The main surface 101 and the back surface 102 are collectively referred to as a surface, and a direction penetrating the main surface 101 and the back surface 102 is referred to as a front and back direction.

As the main surface, a surface provided with an off angle of several degrees (for example, 0.4 to 8°) from a (0001) surface or a (000-1) surface can be exemplified. (In the present specification, in the notation of a Miller index, "-" means a bar attached to the index immediately after the Miller index).

In the description of the present specification, one surface refers to the main surface 101 or the back surface 102, and another surface refers to a surface facing the one surface. The growth layer 11 refers to a layer formed on the SiC base substrate 10 before treatment, and the base substrate layer 12 refers to a layer in which the SiC base substrate 10 before treatment remains.

As the size of the SiC base substrate 10, a chip size of several centimeters square, a 6-inch wafer or an 8-inch wafer can be exemplified.

<Main Container 20>

It is sufficient that the main container 20 is configured to accommodate the SiC base substrate 10 and generate vapor pressure of a gaseous species containing Si element and a gaseous species containing C element in an internal space during the heat treatment. For example, the main container 20 is made of a material containing polycrystalline SiC. In the present embodiment, the entire main container 20 is made of polycrystalline SiC. By heating the main container 20 made of such a material, vapor pressure of a gaseous species containing Si element and a gaseous species containing C element can be generated.

That is, the environment in the heat-treated main container 20 is desirably a vapor pressure environment of a mixed system of a gaseous species containing Si element and a gaseous species containing the C element. Examples of the gaseous species containing Si element include Si, Sit, $Si_3$, $Si_2C$, $SiC_2$, and SiC. Examples of the gaseous species containing the C element include $Si_2C$, $SiC_2$, SiC, and C. That is, the SiC-based gas exists in the main container 20.

The dopant and the doping concentration of the main container 20 can be selected according to the dopant and the doping concentration of the growth layer 11 to be formed. As the dopant, N can be exemplified.

A configuration can be adopted as long as the configuration can generate vapor pressure of a gaseous species containing Si element and a gaseous species containing C element in the internal space during the heating treatment of the main container 20. For example, a configuration in which polycrystalline SiC is exposed on a part of the inner surface, a configuration in which polycrystalline SiC is separately arranged in the main container 20, and the like can be shown.

Figure 3:
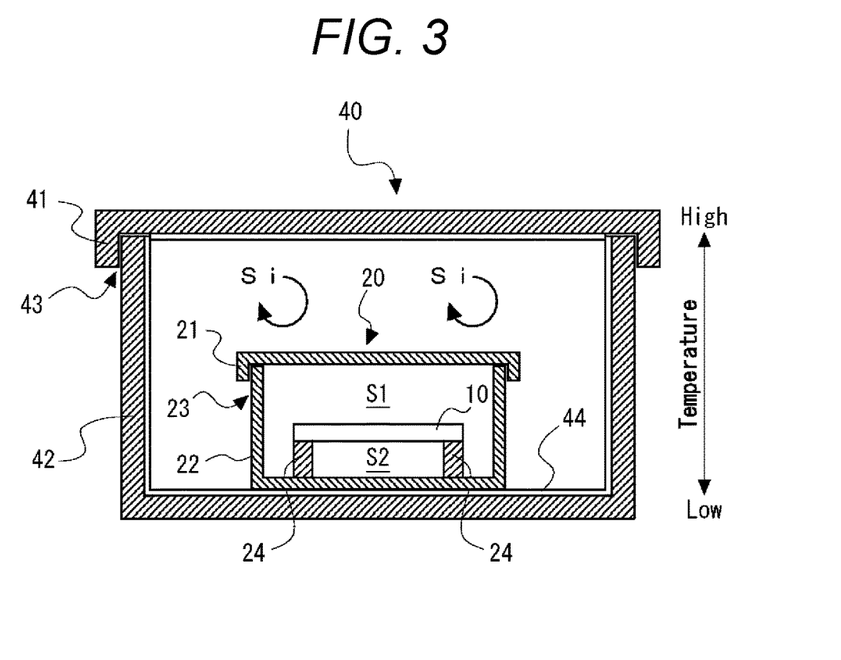
FIG. 3 is an explanatory view of the device for manufacturing the SiC substrate according to the embodiment.

As illustrated in FIG. 3, the main container 20 is a fitting container including an upper container 21 and a lower container 22 that can be fitted to each other. A minute gap 23 is formed in a fitting portion between the upper container 21 and the lower container 22, and the inside of the main container 20 can be exhausted (evacuated) from the gap 23.

The main container 20 includes a growth space S1 in which a growth layer 11 is formed on one surface of the SiC base substrate 10, and an etching space S2 in which another surface of the SiC base substrate 10 is etched.

The growth space S1 is formed by making a portion of the main container 20 arranged on a high temperature side of the temperature gradient face the SiC base substrate 10 in a state where the SiC base substrate 10 is arranged on a low temperature side of the temperature gradient. That is, at least a portion of the main container 20 (for example, the top surface of the upper container 21) becomes higher in temperature than the SiC base substrate 10 due to the temperature gradient provided in the heating furnace 30, and thereby, the growth space S1 is formed.

The growth space S1 is a space for transporting Si atoms and C atoms of the main container 20 to the surface of the SiC base substrate 10 by using a temperature difference provided between the SiC base substrate 10 and the main container 20 as a driving force.

Figure 4:
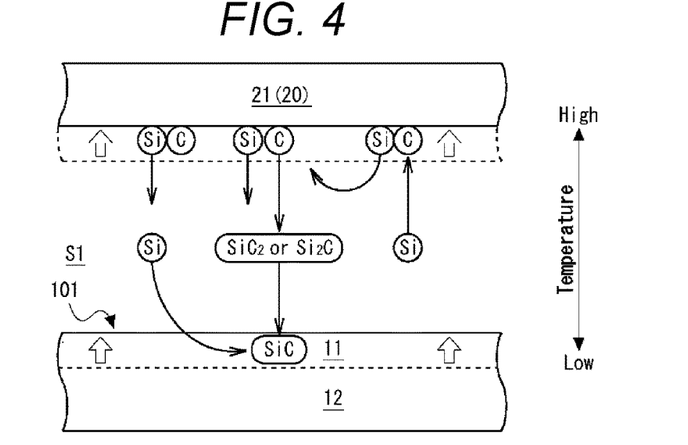
FIG. 4 is an explanatory view of a growth process of a method for manufacturing a SiC substrate according to the embodiment.

For example, the SiC base substrate 10 is arranged such that the temperature on the main surface 101 side is low and the temperature on the top surface side of the upper container 21 is high when the temperature of the main surface 101 (or the back surface 102) of the SiC base substrate 10 is compared with the temperature of the top surface of the upper container 21 facing the main surface 101 (see FIG. 4). As described above, by forming the space (growth space S1) having a temperature difference between the main surface 101 and the top surface of the upper container 21, Si atoms and C atoms on the top surface of the upper container 21 can be transported to the main surface 101 of the SiC base substrate 10 using the temperature difference as a driving force.

The etching space S2 is formed by making a portion of the main container 20 arranged on the low temperature side of the temperature gradient face the SiC base substrate 10 in a state where the SiC base substrate 10 is arranged on the high temperature side of the temperature gradient. That is, at least a portion of the main container 20 (for example, the bottom surface of the lower container 22) becomes lower in temperature than the SiC base substrate 10 due to the temperature gradient provided in the heating furnace 30, and thereby, the etching space S2 is formed.

The etching space S2 is a space for transporting Si atoms and C atoms on the surface of the SiC base substrate 10 to the main container 20 by using a temperature difference provided between the SiC base substrate 10 and the main container 20 as a driving force.

Figure 5:
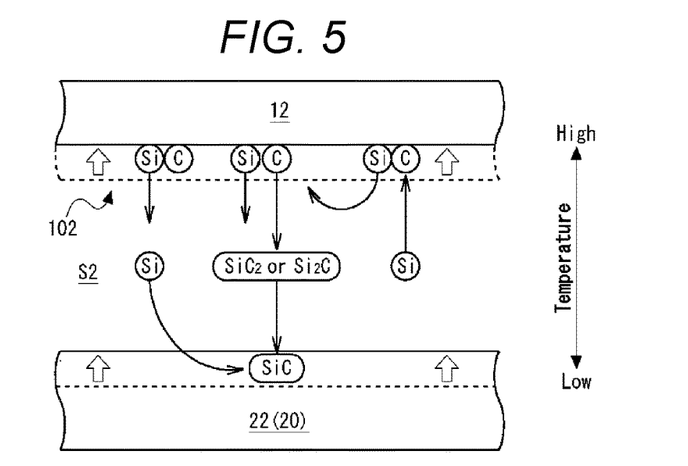
FIG. 5 is an explanatory view of an etching process of the method for manufacturing a SiC substrate according to the embodiment.

For example, the SiC base substrate 10 is arranged such that the temperature on the back surface 102 side is high and the temperature of the bottom surface side of the lower container 22 is low when the temperature of the back surface 102 (or main surface 101) of the SiC base substrate 10 is compared with the temperature of the bottom surface of the lower container 22 facing the back surface 102 (see FIG. 5). As described above, by forming the space (etching space S2) provided with a temperature difference between the back surface 102 and the bottom surface of the lower container 22, Si atoms and C atoms of the back surface 102 can be transported to the bottom surface of the lower container 22 by using the temperature difference as a driving force.

The main container 20 includes a substrate holder 24 provided between the SiC base substrate 10 and the main container 20.

The heating furnace 30 according to the present embodiment is configured to perform heating so as to form a temperature gradient so that the temperature decreases from the upper container 21 toward the lower container 22 of the main container 20. Therefore, by providing the substrate holder 24 capable of holding the SiC base substrate 10 between the SiC base substrate 10 and the lower container 22, the growth space S1 can be formed between the SiC base substrate 10 and the upper container 21 and the etching space S2 can be formed between the SiC base substrate 10 and the lower container 22.

It is sufficient that the substrate holder 24 is configured to hold at least a part of the SiC base substrate 10 in the hollow space of the main container 20. For example, a conventional support means such as one-point support, a three-point support, a configuration for supporting an outer peripheral edge, or a configuration for clamping a part thereof can be naturally employed. As a material of the substrate holder 24, a SiC material or a high melting point metal material can be adopted.

<Heating Furnace 30>

As illustrated in FIG. 1, the heating furnace 30 includes: a main heating chamber 31 capable of heating a workpiece (SiC base substrate 10 or the like) to a temperature of 1000° C. or higher and 2300° C. or lower; a preheating chamber 32 capable of preheating the workpiece to a temperature of 500° C. or higher; a high melting point container 40 capable of accommodating the main container 20; and a moving means 33 (moving table) capable of moving the high melting point container 40 from the preheating chamber 32 to the main heating chamber 31.

The main heating chamber 31 has a regular hexagonal shape in planar cross-sectional view, and the high melting point container 40 is arranged inside the main heating chamber 31.

A heater 34 (mesh heater) is provided inside the main heating chamber 31. A multilayer heat reflective metal plate is fixed to a side wall and a ceiling of the main heating chamber 31 (not illustrated). The multilayer heat reflective metal plate is configured to reflect heat of the heater 34 toward a substantially central portion of the main heating chamber 31.

As a result, in the main heating chamber 31, the heater 34 is arranged so as to surround the high melting point container 40 in which the workpiece is accommodated, and the multilayer heat reflective metal plate is arranged on the outer side thereof, so that the temperature can be raised to a temperature of 1000° C. or higher and 2300° C. or lower.

As the heater 34, for example, a resistance heating type heater or a high frequency induction heating type heater can be used.

The heater 34 may adopt a configuration capable of forming a temperature gradient in the high melting point container 40. For example, the heater 34 may be configured such that many heaters are arranged on the upper side (or lower side). Further, the heater 34 may be configured such that the width increases toward the upper side (or lower side). Alternatively, the heater 34 may be configured to be able to increase the power supplied toward the upper side (or lower side).

A vacuum forming valve 35 for exhausting the inside of the main heating chamber 31, an inert gas injection valve 36 for introducing an inert gas into the main heating chamber 31, and a vacuum gauge 37 for measuring the degree of vacuum in the main heating chamber 31 are connected to the main heating chamber 31.

The vacuum forming valve 35 is connected to an evacuation pump that exhausts and evacuates the inside of the main heating chamber 31 (not illustrated). The degree of vacuum in the main heating chamber 31 can be adjusted to, for example, 10 Pa or lower, more preferably 1 Pa or lower, and still more preferably $10^{-3}$ Pa or lower by the vacuum forming valve 35 and the evacuation pump. Examples of the evacuation pump can include a turbo molecular pump.

The inert gas injection valve 36 is connected to an inert gas supply source (not illustrated). By the inert gas injection valve 36 and the inert gas supply source, the inert gas can be introduced into the main heating chamber 31 in the range of $10^{-5}$ to 10000 Pa. As the inert gas, Ar, He, $N_2$, or the like can be selected.

The inert gas injection valve 36 is a dopant gas supply means capable of supplying a dopant gas into the main container 20. That is, by selecting a dopant gas (for example, $N_2$ or the like) as the inert gas, the growth layer 11 can be doped with a dopant to increase the doping concentration.

The preheating chamber 32 is connected to the main heating chamber 31, and is configured to be able to move the high melting point container 40 by the moving means 33. The preheating chamber 32 of the present embodiment is configured to be capable of raising the temperature by residual heat of the heater 34 of the main heating chamber 31. For example, when the temperature of the main heating chamber 31 is raised to 2000° C., the temperature of the preheating chamber 32 is raised to about 1000° C., and the object to be processed (SiC base substrate 10, main container 20, high melting point container 40, and the like) can be degassed.

The moving means 33 is configured to be able to move the main heating chamber 31 and the preheating chamber 32 with the high melting point container 40 placed thereon. Since the transportation between the main heating chamber 31 and the preheating chamber 32 by the moving means 33 is completed in about 1 minute at the shortest, it is possible to realize temperature rise and temperature drop at 1 to 1000° C./min.

Since the rapid temperature raise and the rapid temperature drop can be performed in this manner, it is possible to observe a surface shape having no low-temperature growth history during temperature rise and temperature drop, which is difficult in conventional devices.

In FIG. 1, the preheating chamber 32 is arranged below main heating chamber 31. However, the present invention is not limited to this, and the preheating chamber 42 may be arranged in any direction.

The moving means 33 according to the present embodiment is a moving table on which the high melting point container 40 is placed. The minute heat is released from the contact portion between the moving table and the high melting point container 40. As a result, a temperature gradient can be formed in the high melting point container 40.

In the heating furnace 30 of the present embodiment, since the bottom of the high melting point container 40 is in contact with the moving table, a temperature gradient is provided so that the temperature decreases from the upper container 41 toward the lower container 42 of the high melting point container 40.

The direction of this temperature gradient can be set to any direction by changing the position of the contact portion between the moving table and the high melting point container 40. For example, in a case where a suspension type or the like is adopted for the moving table and the contact portion is provided on the ceiling of the high melting point container 40, heat is transferred upward. Therefore, the temperature gradient is provided such that the temperature rises from the upper container 41 toward the lower container 42 of the high melting point container 40. This temperature gradient is desirably formed along the front and back direction of the SiC base substrate 10.

As described above, the temperature gradient may be formed by the configuration of the heater 34.

<High Melting-Point Container 40>

The vapor pressure environment of the gaseous species containing Si element in the heating furnace 30 according to the present embodiment is formed using the high melting point container 40 and the Si vapor supply source 44. For example, any method capable of forming a vapor pressure environment of a gaseous species containing Si element around the main container 20 can be employed in the device for manufacturing a SiC substrate of the present invention.

The high-melting-point container 40 contains a high melting point material. For example, C which is a general-purpose heat-resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, $TiB_2$ which are borides, polycrystalline SiC, and the like can be exemplified.

As similar to the main container 20, the high melting point container 40 is a fitting container including an upper container 41 and a lower container 42 that can be fitted to each other, and is configured to be able to accommodate the main container 20. A minute gap 43 is formed in a fitting portion between the upper container 41 and the lower container 42, and the inside of the high melting point container 40 can be exhausted (evacuated) from the gap 43.

The high melting point container 40 preferably includes a Si vapor supply source 44 capable of supplying vapor pressure of a vapor phase species containing Si element into the high melting point container 40. It is sufficient that the Si vapor supply source 44 is configured to generate Si vapor in the high melting point container 40 at the time of heat treatment, and for example, solid Si (Si pellet such as a single crystal Si piece or Si powder) or a Si compound can be exemplified.

The device for manufacturing a SiC substrate according to the present embodiment employs TaC as the material of the high melting point container 40, and employs tantalum silicide as the Si vapor supply source 44. That is, as illustrated in FIG. 3, a tantalum silicide layer is formed inside the high melting point container 40, and Si vapor is supplied into the container from the tantalum silicide layer during the heat treatment, so that a Si vapor pressure environment is formed.

In addition, any configuration can be adopted as long as the vapor pressure of the gaseous species containing Si element is formed in the high melting point container 40 during the heat treatment.

According to a device for manufacturing a SiC substrate according to the present invention, the main container 20 for heat treating the SiC base substrate 10 includes a growth space S1 in which a growth layer 11 is formed on one surface of the SiC base substrate 10, and an etching space S2 in which another surface of the SiC base substrate 10 is etched.

With such a configuration, the SiC base substrate 10 can be grown and etched at the same time, and a SiC substrate having a thin base substrate layer 12 can be manufactured while suppressing deformation and breakage of the SiC base substrate 10.

According to a device for manufacturing a SiC substrate according to the present embodiment, the device includes: a main container 20 capable of accommodating a SiC base substrate 10 and configured to generate vapor pressure of a gaseous species containing Si element and C atoms in an internal space; and a heating furnace 30 that accommodates the main container 20, generates vapor pressure of a gaseous species containing Si element in an internal space, and performs heating in a manner to form a temperature gradient.

With such a configuration, a near-thermal equilibrium state can be formed between the SiC base substrate 10 and the main container 20, and a vapor pressure (partial pressure of gaseous species containing at least any of Si, $Si_2$, $Si_3$, $Si_2C$, $SiC_2$, and SiC) environment of a gaseous species containing Si element and a gaseous species containing C element can be formed in the main container 20.

In such an environment, mass transport occurs using the temperature gradient of the heating furnace 30 as a driving force, and as a result, the growth and etching of the SiC base substrate 10 proceed simultaneously. As a result, it is possible to manufacture a SiC substrate having a thin base substrate layer 12 while suppressing deformation and breakage of the SiC base substrate 10.

According to a SiC substrate manufacturing device according to the present embodiment, the main container 20 is heated under the vapor pressure environment (the Si vapor pressure environment) of the gaseous species containing Si element, and thereby, the gaseous species containing Si element can be suppressed from being exhausted from the inside of the main container 20. That is, by balancing the vapor pressure of the gaseous species containing Si element in the main container 20 and the vapor pressure of the gaseous species containing Si element outside the main container 20, the environment in the main container 20 can be maintained.

In other words, the main container 20 is arranged in the high melting point container 40 in which a vapor pressure environment (for example, a Si vapor pressure environment) of a gaseous species containing Si element is formed. As described above, the inside of the main container 20 is exhausted (evacuated) via the vapor pressure environment (for example, the Si vapor pressure environment) of the gaseous species containing Si element, so that it is possible to suppress a decrease in Si atoms from the inside of the growth space S1 and the etching space S2. As a result, the atomic number ratio Si/C preferable for growth and etching in the growth space S1 and the etching space S2 can be maintained for a long time.

According to a device for manufacturing a SiC substrate according to the present embodiment, the growth space S1 is formed by making a portion of the main container 20 arranged on a high temperature side of the temperature gradient face the SiC base substrate 10 in a state where the SiC base substrate 10 is arranged on a low temperature side of the temperature gradient.

As described above, by forming the growth space S1 so as to face the SiC base substrate 10 and the main container 20, the SiC base substrate and the main container can be grown in an environment in which the temperature distribution in the horizontal direction can be uniformly maintained. As a result, a growth layer 11 with less thermal stress strain and the like can be formed.

According to the device for manufacturing a SiC substrate according to the present embodiment, the main container 20 is made of polycrystalline SiC. With such a configuration, when the main container 20 is heated using the heating furnace 30, only the vapor pressure of the gaseous species containing Si element and the gaseous species containing the C element can be generated in the main container 20.

[Method for Manufacturing SiC Substrate]

Hereinafter, a method for manufacturing a SiC substrate according to an embodiment of the present invention will be described in detail.

As illustrated in FIG. 2, in the method for manufacturing a SiC substrate according to the present embodiment, the growth process of forming the growth layer 11 on one surface of the SiC base substrate 10 and the etching process of etching another surface of the SiC base substrate 10 are simultaneously performed.

In this embodiment, the same reference signs are given to components that are basically the same as those in the above device for manufacturing a SiC substrate, and the description thereof will be simplified.

Any method can be adopted as long as the method can simultaneously perform the growth process of forming the growth layer 11 on one surface of the SiC base substrate 10 and the etching process of etching another surface of the SiC base substrate 10. For example, a method (CVD method or the like) of simultaneously performing the growth and the etching by supplying the growth gas to one surface of the SiC base substrate 10 and supplying the etching gas to another surface of the SiC base substrate 10 may be adopted.

In the growth process and the etching process according to the present embodiment, the SiC base substrate 10 is arranged inside a main container 20 that generates vapor pressure of a gaseous species containing Si element and a gaseous species containing C element in an internal space, and the main container 20 is heated in a manner to form a temperature gradient under an environment of vapor pressure of the gaseous species containing Si element.

Hereinafter, the growth process and the etching process of the method for manufacturing a SiC substrate according to the present embodiment will be described in detail.

<Growth Process>

In the growth process according to the present embodiment, the growth layer 11 is formed by making the SiC base substrate 10 arranged on the low temperature side of the temperature gradient face a portion of the main container 20 arranged on the high temperature side of the temperature gradient.

FIG. 4 is an explanatory diagram illustrating an outline of a growth mechanism. It is considered that, by heating the main container 20 in which the SiC base substrate 10 is arranged in a temperature range of equal to or higher than 1400° C. and equal to or lower than 2300° C., the reactions of the following 1) to 5) are continuously performed in the growth space S1, and as a result, growth of the growth layer 11 proceeds.

Explanation of 1): When the main container 20 (Poly-SiC(s)) is heated, Si atoms (Si(v)) are desorbed from SiC by thermal decomposition.

Explanation of 2) and 3): C (C(s)) remaining on the surface of the SiC base substrate 10 due to desorption of Si atoms (Si(v)) reacts with Si vapor (Si(v)) in the main container 20 to become $Si_2C$ or $SiC_2$, or the like, and is sublimated in the main container 20.

Explanation of 4) and 5): Sublimed $Si_2C$ or $SiC_2$, or the like reaches and diffuses at the terrace of the SiC base substrate 10 due to a temperature gradient, and reaches a step, so that the growth layer 11 grows by taking over the polymorph of the base substrate layer 12 (step flow growth).

That is, the growth process includes a Si atom sublimation process of thermally sublimating Si atoms from the main container 20, and a C atom sublimation process of sublimating C atoms remaining on the surface of the main container 20 by reacting the C atoms with Si atoms in the main container 20.

Specifically, one surface (the main surface 101 or the back surface 102) of the SiC base substrate 10 and the top surface of the main container 20 having a temperature higher than that of the one surface are arranged to face each other, and the growth space S1 is formed therebetween, and thereby, the growth layer 11 can be grown.

In other words, in the growth process, the SiC base substrate 10 and a portion of the main container 20 are arranged to face each other, and heating is performed with a temperature gradient so that a portion of the main container 20 is on the high temperature side and the SiC base substrate 10 is on the low temperature side. With this temperature gradient, the Si element and the C element are transported from the main container 20 to the SiC base substrate 10, and the growth layer 11 is grown in the SiC base substrate 10.

In the growth process, the doping concentration of the growth layer 11 can be adjusted by supplying the dopant gas into the main container 20 using the dopant gas supply means (inert gas injection valve 36).

That is, in a case where the dopant gas is not supplied, the growth layer 11 is formed with the same doping concentration as that of the main container 20. On the other hand, the doping concentration in the growth layer 11 can be increased by supplying the dopant gas, and thereby, the growth layer 11 having a desired doping concentration can be formed.

<Etching Process>

In the etching process according to the present embodiment, etching is performed by making the SiC base substrate 10 arranged on the high temperature side of the temperature gradient face a portion of the main container 20 arranged on the low temperature side of the temperature gradient.

FIG. 5 is an explanatory diagram illustrating an outline of an etching mechanism. It is considered that, by heating the main container 20 in which the SiC base substrate 10 is arranged in a temperature range of equal to or higher than 1400° C. and equal to or lower than 2300° C., the reactions of the following 1) to 5) are continuously performed in the etching space S2, and as a result, etching of the base substrate layer 12 proceeds.

$$\text{Poly-SiC}(s) \rightarrow \text{Si}(v) + \text{C}(s) \quad 1)$$

$$2\text{C}(s) + \text{Si}(v) \rightarrow \text{SiC}_2(v) \quad 2)$$

$$\text{C}(s) + 2\text{Si}(v) \rightarrow \text{Si}_2\text{C}(v) \quad 3)$$

$$\text{Si}(v) + \text{SiC}_2(v) \rightarrow 2\text{SiC}(s) \quad 4)$$

$$\text{Si}_2\text{C}(v) \rightarrow \text{Si}(v) + \text{SiC}(s) \quad 5)$$

Explanation of 1): When the SiC base substrate 10 (SiC(s)) is heated, Si atoms (Si(v)) are desorbed from the surface of the SiC base substrate 10 by thermal decomposition (Si atom sublimation process).

Explanation of 2) and 3): C(C(s)) remaining on the surface of the SiC base substrate 10 due to desorption of Si atoms (Si(v)) reacts with Si vapor (Si(v)) in the main container 20 to become $Si_2C$ or $SiC_2$, or the like, and is sublimated in the main container 20 (C atom sublimation process).

Explanation of 4) and 5): Sublimed $Si_2C$, $SiC_2$, or the like reaches the bottom surface (polycrystalline SiC) in the main container 20 by a temperature gradient and grows.

That is, the etching process includes a Si atom sublimation process of thermally sublimating Si atoms from the surface of the SiC base substrate 10, and a C atom sublimation process of sublimating C atoms from the surface of the SiC base substrate 10 by combining C atoms remaining on the surface of the SiC base substrate 10 with Si atoms in the main container 20.

Specifically, another surface (the back surface 102 or the main surface 101) of the SiC base substrate 10 and the bottom surface of the main container 20 having a temperature lower than that of the another surface are arranged to face each other, and the etching space S2 is formed therebetween, and thereby, the base substrate layer 12 can be etched.

In other words, in the etching process, the SiC base substrate 10 and a portion of the main container 20 are arranged to face each other, and heating is performed with a temperature gradient so that a portion of the main container 20 is on the low temperature side and the SiC base substrate 10 is on the high temperature side. With this temperature gradient, the Si element and the C element are transported from the SiC base substrate 10 to the main container 20, and the SiC base substrate 10 is etched.

The etching temperature in this method is preferably set in a range of 1400 to 2300° C., and more preferably set in a range of 1600 to 2000° C.

The growth rate and the etching rate in this method can be controlled by the above temperature range, and can be selected in the range of 0.001 to 2 μm/min.

The growth time and the etching time in this method can be set to any time so as to obtain a desired growth amount and etching amount. For example, when the growth rate (etching rate) is 1 μm/min and the growth amount (etching amount) is desired to be 1 μm, the growth amount (etching time) is 1 minute.

The temperature gradient in this method is set in the range of 0.1 to 5° C./mm in the growth space S1 and the etching space S2.

In the present method, a dopant gas ($N_2$ or the like) can be supplied, and can be introduced into the main heating chamber 31 at $10^{-3}$ to 10000 Pa.

EXAMPLES

SiC substrates of Examples 1 and 2 were manufactured by the following method.

Example 1

The SiC base substrate 10 was accommodated in the main container 20 and the high melting point container 40 under the following conditions (arranging process).

[SiC Base Substrate 10]
   Polymorphism: 4H—SiC
   Substrate size: width 10 mm×length 10 mm×thickness 0.3 mm
   Off direction and off angle: <11-20> direction 4° off
   Growth surface: (0001) surface
   Etching surface: (000-1) surface
   Dopant: N
   Doping concentration: $3\times10^{18}$ $cm^{-3}$
   The dopant and doping concentration of the SiC base substrate 10 were checked by RAMAN spectroscopy. These can also be checked by secondary ion mass spectrometry (SIMS) or the like.

[Main Container 20]
   Material: polycrystalline SiC
   Container size: diameter 60 mm×height 4 mm
   Material of substrate holder 24: single crystal SiC
   Distance between SiC base substrate 10 and bottom surface of main container 20: 2 mm
   Dopant: N
   Doping concentration: equal to or lower than $1\times10^{17}$ $cm^{-3}$ (RAMAN spectroscopy detection limit or lower)

[High Melting Point Container 40]
   Material: TaC
   Container size: diameter 160 mm×height 60 mm
   Si vapor supply source 44 (Si compound): $TaSi_2$

[Growth Process and Etching Process]
The SiC base substrate 10 arranged under the above conditions was subjected to heat treatment under the following conditions.
   Heating temperature: 1700° C.
   Heating time: 300 min
   Temperature gradient: 1° C./mm
   Growth rate: 5 nm/min
   Etching rate: 5 nm/min
   Vacuum degree of main heating chamber 31: $10^{-5}$ Pa (without introduction of dopant gas)

Figure 6:
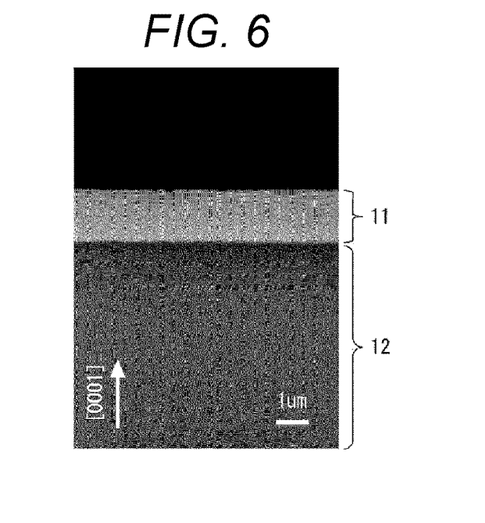
FIG. 6 is a cross-sectional SEM image of a SiC substrate grown and etched by the method for manufacturing a SiC substrate according to the embodiment.

FIG. 6 is a SEM image obtained by observing the SiC substrate of Example 1 grown and etched under the above conditions at a magnification×10000 from the cross section.

The thickness of the growth layer 11 of Example 1 was 1.5 μm, and the etching amount of the base substrate layer 12 was 1.5 μm.

The doping concentration of the growth layer 11 of Example 1 was equal to or lower than $1\times10^{17}$ $cm^{-3}$, and the doping concentration of the base substrate layer 12 was $3\times10^{18}$ $cm^{-3}$. That is, the doping concentration of the growth layer 11 is lower than the doping concentration of the SiC base substrate 10. This can also be checked from the fact that the growth layer 11 has a brighter SEM image contrast than the base substrate layer 12 as illustrated in FIG. 6.

Example 2

The SiC base substrate 10 was accommodated in the main container 20 and the high melting point container 40 under the following conditions.

[SiC Base Substrate 10]
   A SiC base substrate 10 similar to that of Example 1 was used.

[Main Container 20]
   A main container 20 similar to that of Example 1 was used.

[High Melting Point Container 40]
   A high melting point container 40 similar to that of Example 1 was used.

[Growth Process and Etching Process]

The SiC base substrate 10 arranged under the above conditions was subjected to heat treatment under the following conditions.

Heating temperature: 1800° C.
Heating time: 60 min
Temperature gradient: 1° C./mm
Growth rate: 50 nm/min
Etching rate: 50 nm/min
Vacuum degree of main heating chamber 31: 13 Pa ($N_2$ gas introduction)

Figure 7:
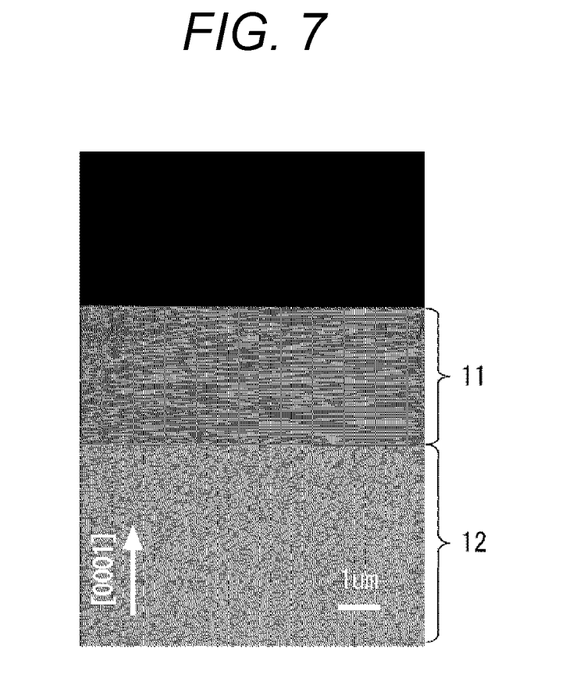
FIG. 7 is a cross-sectional SEM image of a SiC substrate grown and etched by the method for manufacturing a SiC substrate according to the embodiment.

FIG. 7 is a SEM image obtained by observing the SiC substrate of Example 2 grown and etched under the above conditions at a magnification×10000 from the cross section.

The thickness of the growth layer 11 of Example 2 was 3 μm, and the etching amount of the base substrate layer 12 was 3 μm.

The doping concentration of the growth layer 11 of Example 2 was $2\times10^{19}$ cm$^{-3}$, and the doping concentration of the base substrate layer 12 was $3\times10^{18}$ cm$^{-3}$. That is, the doping concentration of the growth layer 11 is higher than the doping concentration of the SiC base substrate 10. This can also be checked from the fact that the growth layer 11 has a darker SEM image contrast than the base substrate layer 12 as illustrated in FIG. 7.

According to the method for manufacturing a SiC substrate according to the present invention, the growth process of forming the growth layer 11 on one surface of the SiC base substrate 10 and the etching process of etching another surface of the SiC base substrate 10 are simultaneously performed. As a result, it is possible to manufacture a SiC substrate having a thin base substrate layer 12 while suppressing deformation and breakage of the SiC base substrate 10.

According to the method for manufacturing a SiC substrate of the present invention, the doping concentration of the growth layer 11 can be made lower than the doping concentration of the SiC base substrate 10. As described above, in a case where the doping concentration of the growth layer 11 is set to be lower than the doping concentration of the SiC base substrate 10, the growth layer 11 can be used as a withstand voltage layer of the device, so that the base substrate layer 12 can be thinned to contribute to reduction in on-resistance of the SiC semiconductor device.

According to the method for manufacturing a SiC substrate of the present invention, the doping concentration of the growth layer 11 can be made higher than the doping concentration of the SiC base substrate 10. As described above, in a case where the doping concentration of the growth layer 11 is set to be higher than the doping concentration of the SiC base substrate 10, the SiC substrate can be a highly doped substrate, and it is possible to contribute to the reduction of the on-resistance of the SiC semiconductor device.

REFERENCE SIGNS LIST

10 SiC base substrate
101 Main surface
102 Back surface
11 Growth layer
12 Base substrate layer
20 Main container
24 Substrate holder
30 Heating furnace
40 High melting point container
44 Si vapor supply source
S1 Growth space
S2 Etching space

The invention claimed is:

1. A method for manufacturing a SiC substrate, wherein a growth process of forming a growth layer on one surface of a SiC base substrate and an etching process of etching another surface of the SiC base substrate, where the one surface of the SiC base substrate is on an opposite side of the another surface of the SiC base substrate, are simultaneously performed,
   wherein in the growth process and the etching process, the SiC base substrate is accommodated inside a main container that generates vapor pressure of a gaseous species containing a Si element and a gaseous species containing a C element in an internal space, and
   the main container is heated to form a temperature gradient, thereby transporting the gaseous species containing the Si element and the gaseous species containing the C element from the main container to the one surface of the SiC base substrate using the temperature gradient as a driving force to form a growth layer on the one surface of the SiC base substrate and
   transporting the gaseous species containing the Si element and the gaseous species containing the C element from the another surface of the SiC base substrate to the main container using the temperature gradient as a driving force to etch the another surface of the SiC base substrate.

2. The method for manufacturing a SiC substrate according to claim 1, wherein, in the growth process and the etching process, the temperature gradient is formed under an environment of vapor pressure of the gaseous species containing Si element.

3. The method for manufacturing a SiC substrate according to claim 1, wherein, in the growth process, the growth layer is formed by making the SiC base substrate arranged on a low temperature side of the temperature gradient face a portion of the main container arranged on a high temperature side of the temperature gradient.

4. The method for manufacturing a SiC substrate according to claim 1, wherein, in the etching process, the SiC base substrate arranged on the high temperature side of the temperature gradient and a portion of the main container arranged on the low temperature side of the temperature gradient are etched while facing each other.

5. The method for manufacturing a SiC substrate according to claim 1, wherein, in the growth process, a doping concentration of the growth layer is made the same as a doping concentration of the SiC base substrate.

6. The method for manufacturing a SiC substrate according to claim 1, wherein, in the growth process, a doping concentration of the growth layer is made lower than a doping concentration of the SiC base substrate.

7. The method for manufacturing a SiC substrate according to claim 1, wherein, in the growth process, a doping concentration of the growth layer is made higher than a doping concentration of the SiC base substrate.

8. The method for manufacturing a SiC substrate according to claim 1, wherein the etching process and the growth process are processes of arranging the SiC substrate in a space in which air is exhausted through an environment of vapor pressure of a gaseous species containing Si element and heating the SiC substrate.

9. The SiC substrate manufactured by the method according to claim 1.

* * * * *